:::

United States Patent [19]
Liu

[11] Patent Number: 5,705,418
[45] Date of Patent: Jan. 6, 1998

[54] PROCESS FOR FABRICATING REDUCED-THICKNESS HIGH-RESISTANCE LOAD RESISTORS IN FOUR-TRANSISTOR SRAM DEVICES

[75] Inventor: Ming-Hsi Liu, Chungli, Taiwan

[73] Assignee: Winbond Electronics Corporation, Taiwan

[21] Appl. No.: 677,200

[22] Filed: Jul. 9, 1996

[30] Foreign Application Priority Data

Jun. 1, 1996 [TW] Taiwan ............... 85106542

[51] Int. Cl.$^6$ ............................................. H01L 21/8244
[52] U.S. Cl. .................... 437/46; 437/60; 437/918; 437/968
[58] Field of Search ........................ 437/46, 47, 48, 437/60, 918, 968; 148/DIG. 117, DIG. 136

[56] References Cited

U.S. PATENT DOCUMENTS

| | | | |
|---|---|---|---|
| 4,285,117 | 8/1981 | Heeren | 437/968 |
| 4,643,777 | 2/1987 | Maeda | 437/918 |
| 5,496,762 | 3/1996 | Sandhu et al. | 437/60 |
| 5,514,617 | 5/1996 | Liu | 437/60 |

*Primary Examiner*—Chandra Chaudhari
*Attorney, Agent, or Firm*—Rabin, Champagne & Lynt, P.C.

[57] ABSTRACT

A process for fabricating load resistors for memory cell units of semiconductor SRAM device. The process includes providing a silicon substrate containing an intermediate semiconductor device with a gate structure and source/drain regions for a transistor of the cell unit. A first dielectric layer is then formed over the surface of the silicon substrate, the first dielectric layer having opening vias connecting to the gate electrode of the gate structure and a source/drain region. A polysilicon layer is then deposited. The polysilicon layer is then patterned by etching to form a discontinuity between the gate electrode and one of the source/drain regions. An oxidation resistant layer is formed and patterned for exposing regions of the polysilicon layer designated for the formation of the load resistors. An oxide layer is formed over the surface of the exposed portions of the polysilicon layer, so that the thickness of the designated regions of the polysilicon layer underneath the oxide layer is reduced. These designated regions will form the load resistors. The oxidation resistant layer is then removed. Impurity ions are then implanted into exposed regions of the polysilicon layer, not covered by the oxide layer, which are designated for forming interconnectors for the memory cell unit.

8 Claims, 14 Drawing Sheets

PROCESS FOR FABRICATING REDUCED-THICKNESS HIGH-RESISTANCE LOAD RESISTORS IN FOUR-TRANSISTOR SRAM DEVICES

BACKGROUND OF THE INVENTION

1. Field of the Invention

The invention relates in general to a process for fabricating semiconductor integrated circuit (IC) devices. In particular, the invention is directed to a process for fabricating load resistors for static random access memory (SRAM) semiconductor IC devices, that utilizes reduced load resistor thickness to increase the resistance.

2. Description of the Related Art

An SRAM is a widely utilized semiconductor IC memory device having special importance in applications to the digital electronic information industry. Measures to increase device integration density by reducing IC device size, while maintaining good device quality, have long been goals in the making of this category of semiconductor memory IC device. Load resistors are components of the memory cells of typical SRAM devices. SRAM memory cell load resistors are normally sections of polysilicon that are undoped, or lightly doped with impurity ions.

A conventional SRAM IC device comprises a matrix of typical memory cell units, such as the SRAM memory cell shown in FIG. 1. The memory cell of FIG. 1 has a pair of load resistors $R_1$ and $R_2$, a pair of pull-down transistors $Q_1$ and $Q_2$, and a pair of pass transistors $Q_3$ and $Q_4$. All the four memory cell transistors employ the same first polysilicon layer to form their transistor gate electrodes. High-resistance sections of a second polysilicon layer are used as the necessary load resistors for the memory cells. Other sections of the second polysilicon layer, having lower resistance, are used as the interconnectors, also necessary for the fabricated device.

Prior art techniques have thus been utilizing the same layer of polysilicon in the device to implement both load resistors and interconnectors. Those sections to be made into load resistors are either lightly doped or not doped at all. Those sections to be made into interconnectors, on the other hand, are heavily doped. Interconnectors and load resistors together form the electrical path leading from power supply source $V_{CC}$ to the nodes A and B shown in FIG. 1 of the drawing. Since the same polysilicon layer (polysilicon 2) is used for the formation of both the interconnectors and the load resistors, the interconnectors and load resistors will therefore have substantially the same thickness.

In order to show the process for the fabrication of the load resistors for these conventional SRAM devices, an example is briefly described below.

FIGS. 2A–2J are respective cross-sectional views of a sequence of process stages during fabrication of load resistors of a conventional SRAM device.

First, as is shown in the intermediate semiconductor device of FIG. 2A, a silicon substrate 10 is provided as a base, with a gate electrode 12 for the gate structure and a pair of source/drain regions 14 and 16 of a transistor, thereon. Then, an inter-polysilicon dielectric layer 18 is formed on the surface of the substrate covering the transistor. Referring to FIG. 2B, a photoresist layer 20, having openings exposing the dielectric layer in locations corresponding to the gate 12 and one source/drain region 14, is formed. Referring to FIG. 2C, this is followed by etching to remove the exposed portions of the dielectric layer 18. This results in the formation of vias in the dielectric layer 18 above the gate electrode 12 and the source/drain region 14.

Then, as is shown in FIG. 2D, the photoresist layer 20 is removed, followed by the deposition of a polysilicon layer 22. At this stage, in some conventional fabricating processes, an ion implantation procedure may be performed on the polysilicon layer 22 to form lightly-doped implantation regions. In other prior art processes, an ion implantation procedure is not performed.

Then, as shown in FIG. 2E, on the surface of the polysilicon layer 22, another photoresist layer 24 is formed, the photoresist layer having openings exposing the surface of portions polysilicon layer required to be removed, including the portions between the source/drain region 14 and the gate 12. Then, as shown in FIG. 2F, these portions of the polysilicon layer 22 are removed by etching, resulting in an open circuit between the source/drain region 14 and the gate 12. Then, as shown as shown in FIG. 2G, the photoresist layer 24 is removed.

Next, as is shown in FIG. 2H, still another photoresist layer 26 is formed on the surface of the device substrate. The patterning in this photoresist layer 26 is intended to inclusively shield those portions of the polysilicon layer 22 designated for the formation of the load resistors. The exposed areas, that is the areas not covered by the photoresist layer 26, are thus those designated for device interconnectors. Thus, as shown in FIG. 2I, a heavy dosage of impurity ions is implanted in those regions not covered by the photoresist layer 26, so that heavily-doped regions are formed in those interconnectors in the polysilicon layer 22, resulting in a reduction of the interconnector resistance. Interconnectors so formed include a $V_{CC}$ conductor 28, a drain conductor 30, and a gate conductor 32.

Finally, as shown in FIG. 2J, the photoresist layer 26 is removed. The newly exposed lightly-doped or undoped regions are now load resistors 34 for the fabricated SRAM memory cell unit.

As indicated, this described prior art process of fabricating of the load resistors for SRAM memory cell units employs the same single polysilicon layer to fabricate both its load resistors and its interconnectors. Those portions of the single polysilicon layer formed into the load resistors are either lightly-doped or undoped regions, while the portions formed into the interconnectors are heavily-doped regions.

The major drawback of such a prior art process for the fabrication of SRAM memory cell units is that since the thickness in the load resistor regions is substantially the same as that in the interconnectors, it is difficult to increase the resistance in the load resistors by having the thickness of the load resistors reduced, without also reducing the thickness of the interconnectors. This is because the thickness of the interconnectors will be adversely affected and their resistance undesirably increased. The direct result of such a reduction in thickness would be a deterioration of interconnector conductivity.

SUMMARY OF THE INVENTION

It is therefore an object of the invention to provide a process for fabricating high-resistance load resistors for SRAM memory cell units by reducing load resistor thickness.

It is another object of the invention to provide a process for fabricating high-resistance load resistors for SRAM memory cell units having reduced load resistor thickness, without adversely affecting the resistance of the interconnectors.

3

To achieve the above-identified objects, the invention provides a process for fabricating load resistors for memory cell units of semiconductor SRAM device. The process includes the following steps: First, a silicon substrate containing an intermediate semiconductor device, including the gate structure and source/drain regions for the transistor element of the cell unit, is provided. A first dielectric layer is then formed over the surface of the silicon substrate. The first dielectric layer has opening vias connecting to the gate electrode of the gate structure and the source/drain region. A polysilicon layer is then deposited. The polysilicon layer is patterned by etching in order to form a discontinuity between the gate electrode and the source/drain region. An oxidation resistant layer is then formed and patterned to expose regions in the polysilicon layer designated for the formation of the load resistors. An oxide layer is formed over the surface of the exposed portions of the polysilicon layer. The formation of the oxide layer reduces the thickness of the portions of the polysilicon layer underneath it, which portions are designated for forming the load resistors. The oxidation resistant layer is then removed. Impurity ions are then implanted in the exposed regions of the polysilicon layer not covered by the oxide layer, which are the regions designated for forming interconnectors for the memory cell unit.

BRIEF DESCRIPTION OF THE DRAWINGS

The invention is described below by way of a preferred embodiment, with reference to the drawings, in which.

DETAILED DESCRIPTION OF THE PREFERRED EMBODIMENT

Figure 1:
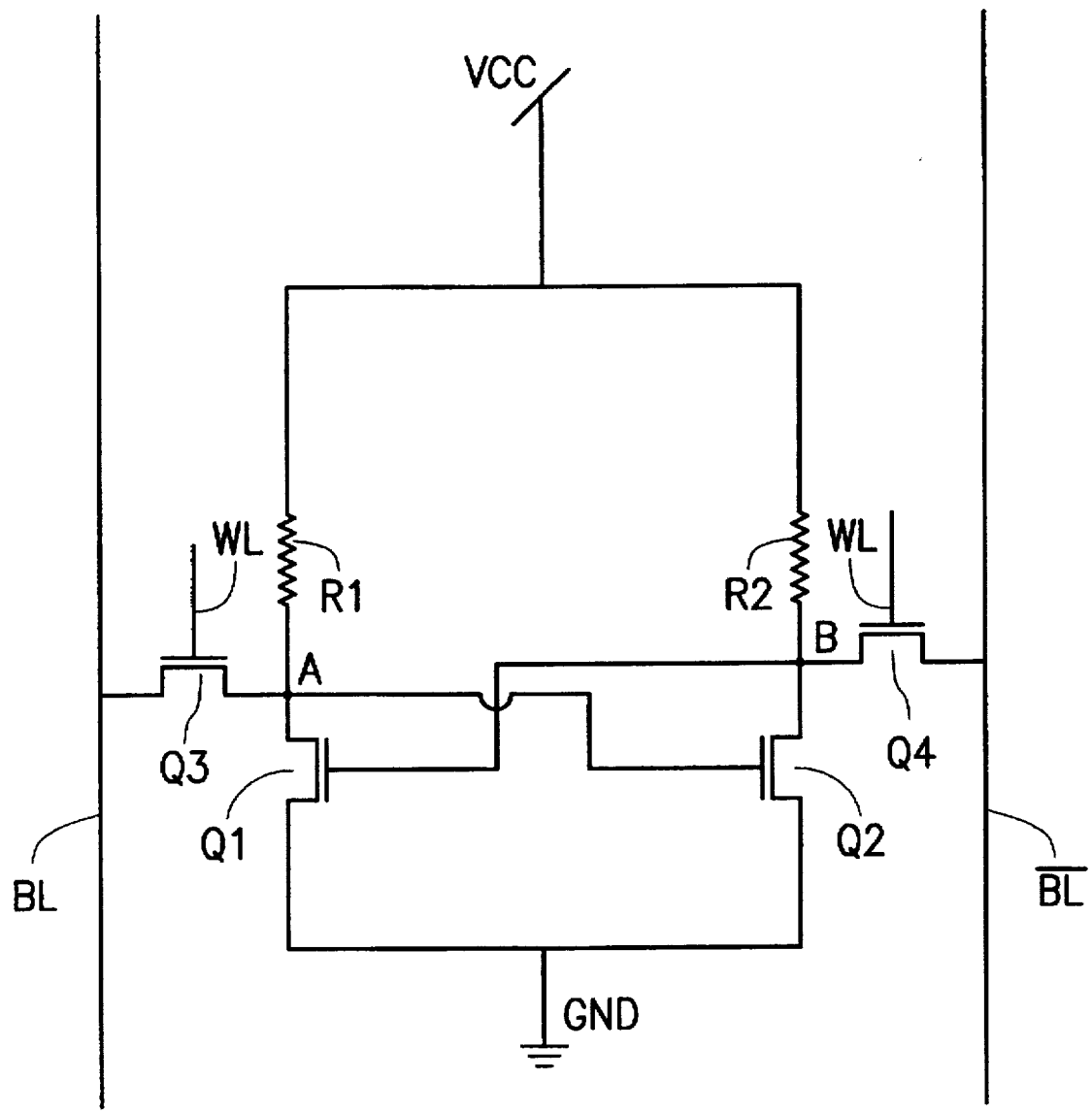
FIG. 1 is a schematic diagram showing the circuitry of an SRAM memory cell.
Figure 2A:
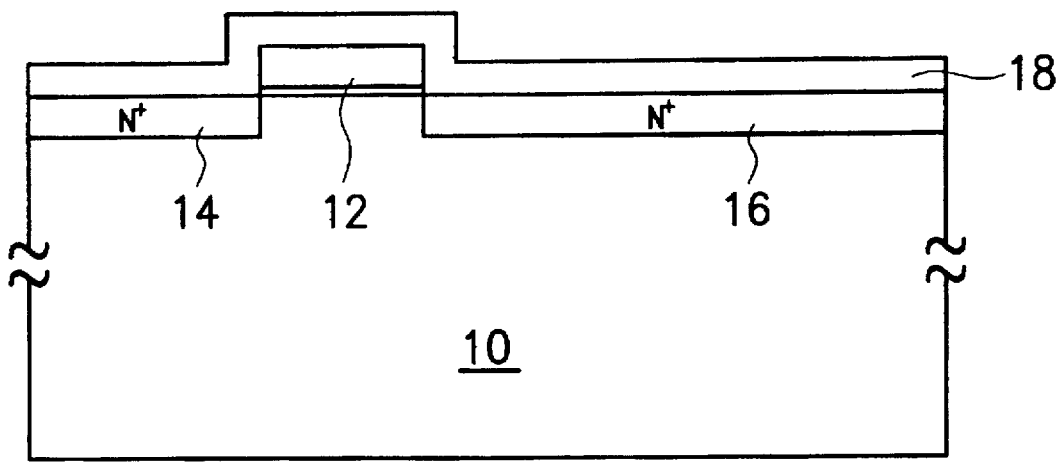
FIGS. 2A–2J are cross-sectional views respectively showing successive stages during the fabricating stage of the load resistors of a conventional SRAM device.
Figure 2B:
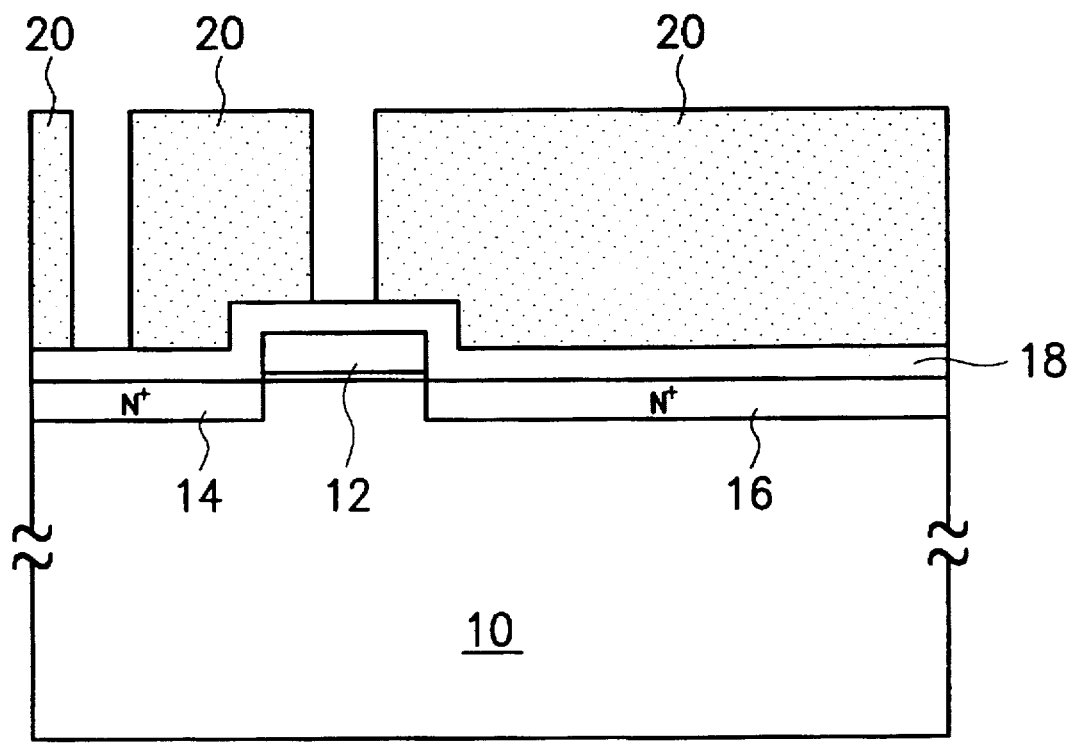
Figure 2C:
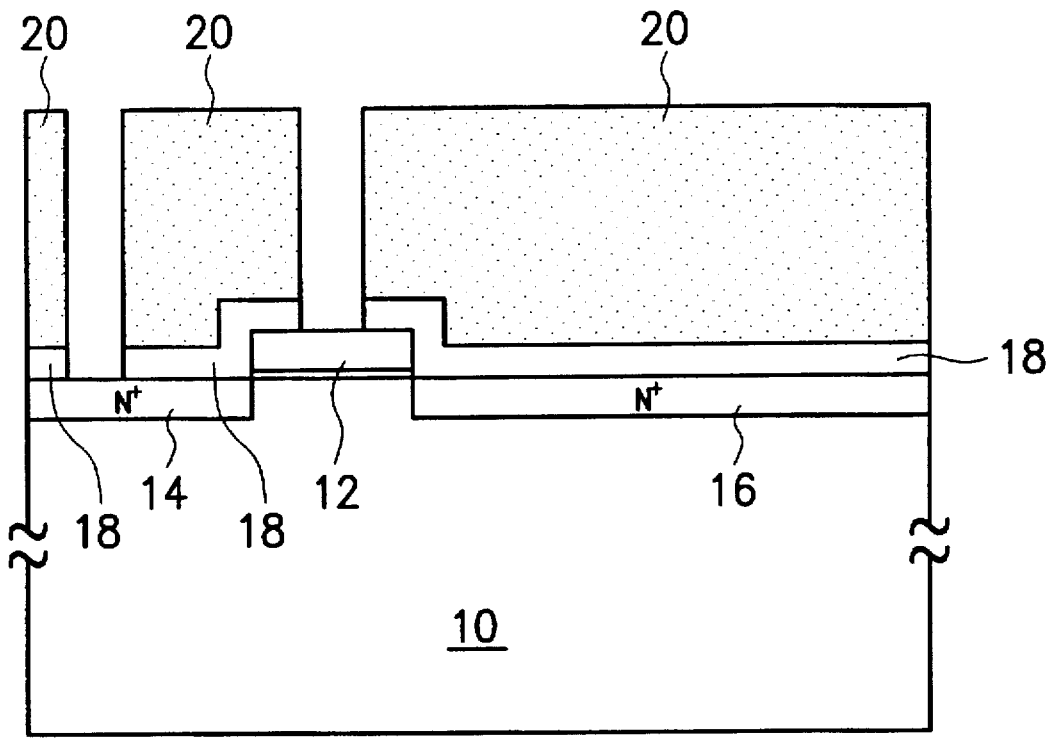
Figure 2D:
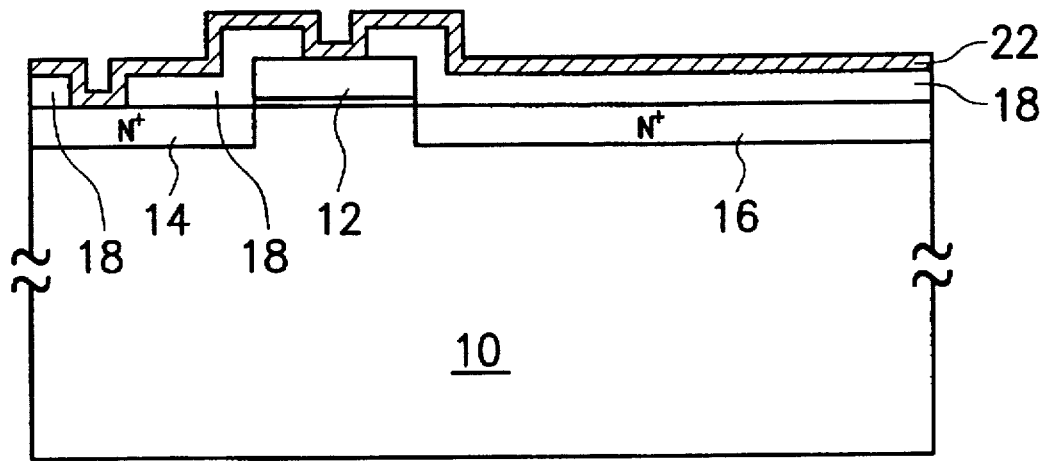
Figure 2E:
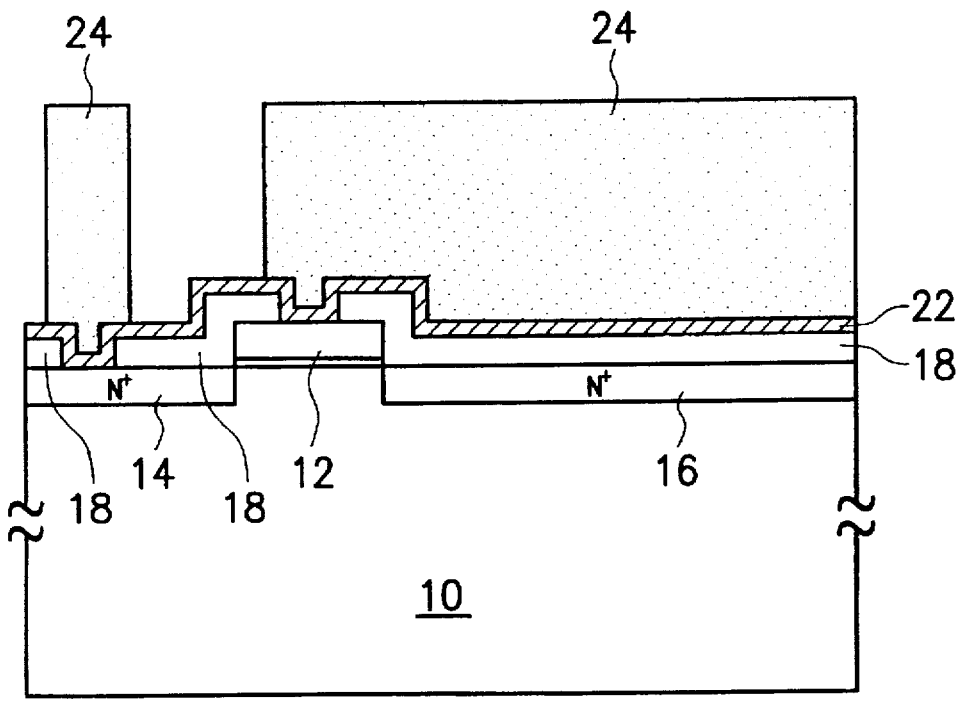
Figure 2F:
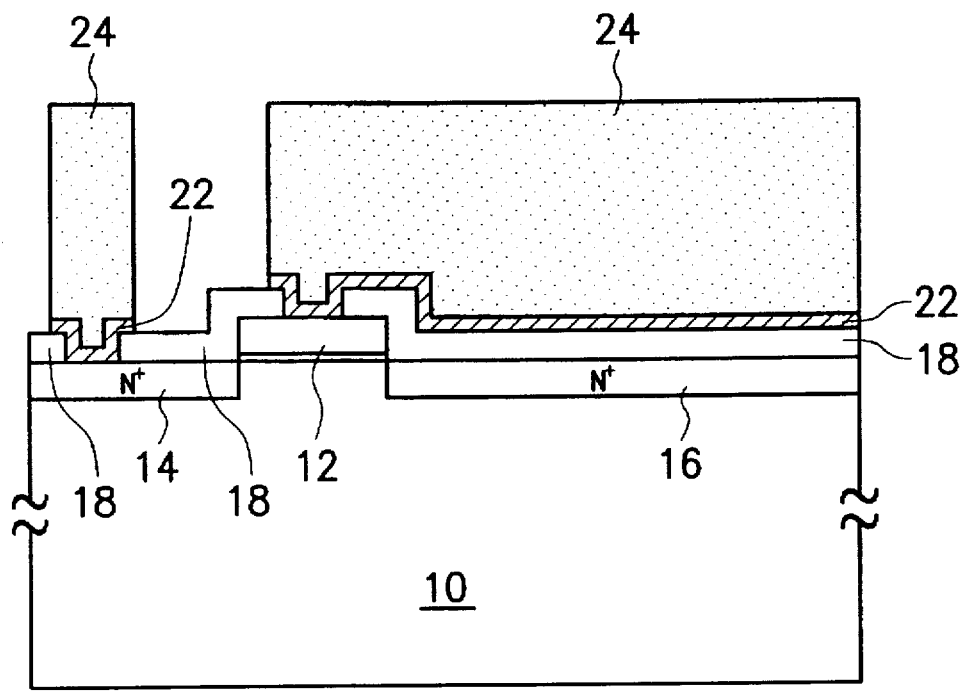
Figure 2G:
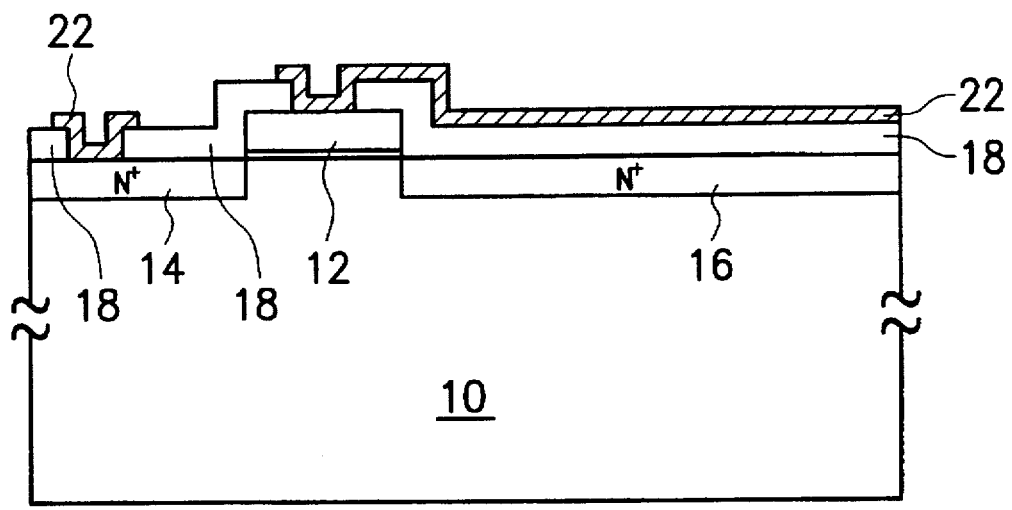
Figure 2H:
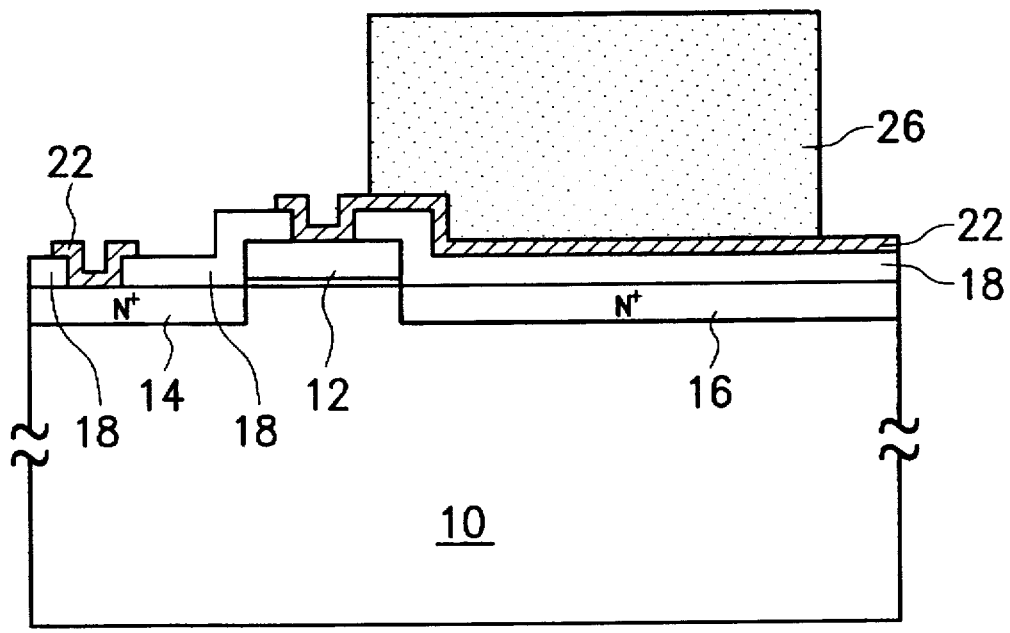
Figure 2I:
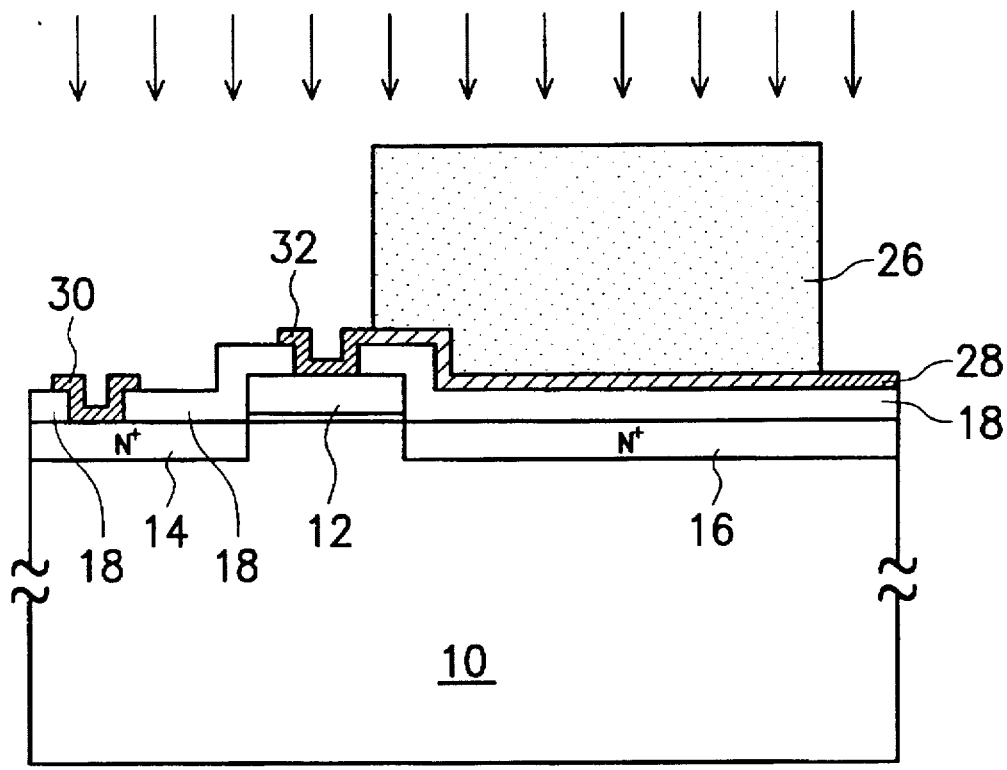
Figure 2J:
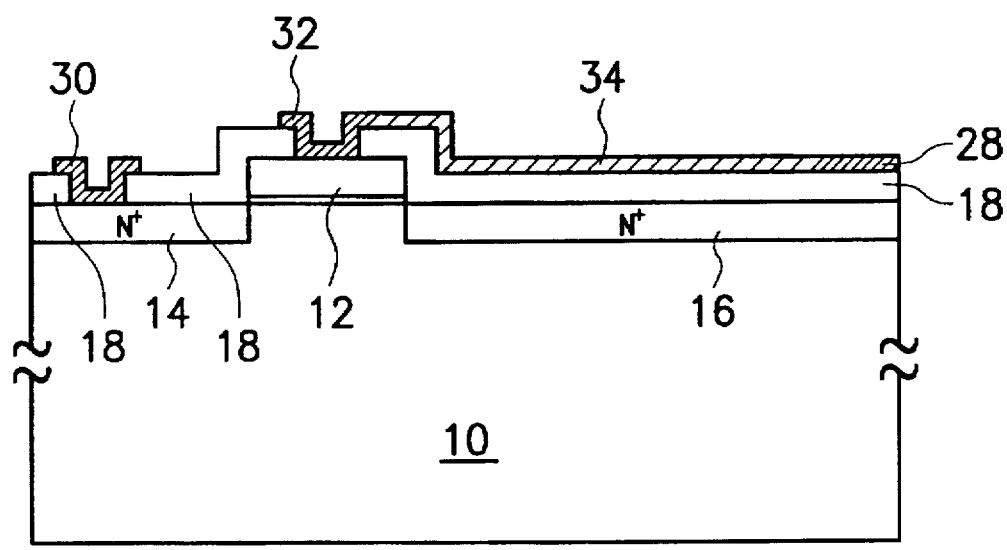
Figure 3A:
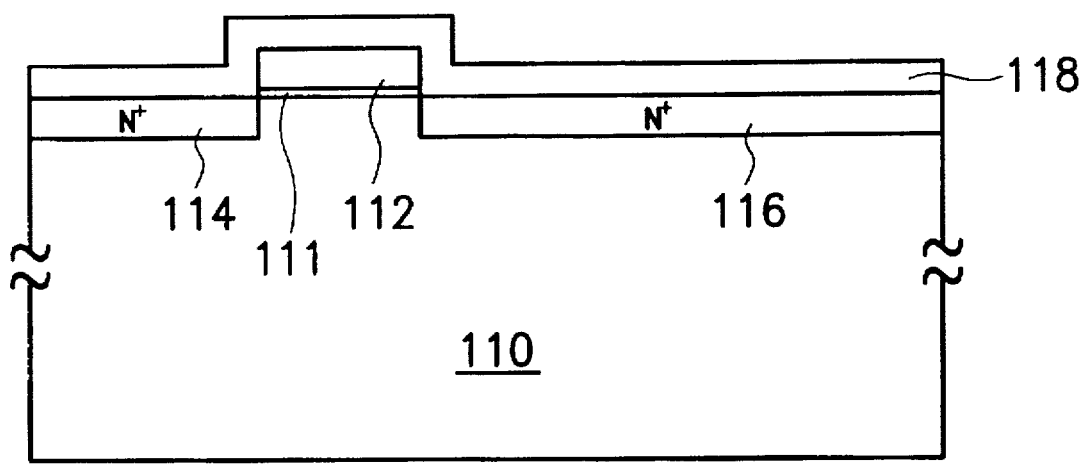
FIGS. 3A–3P are cross-sectional views respectively of successive stages of fabrication of load resistors of an SRAM device, in accordance with a preferred embodiment of the invention.
Figure 3B:
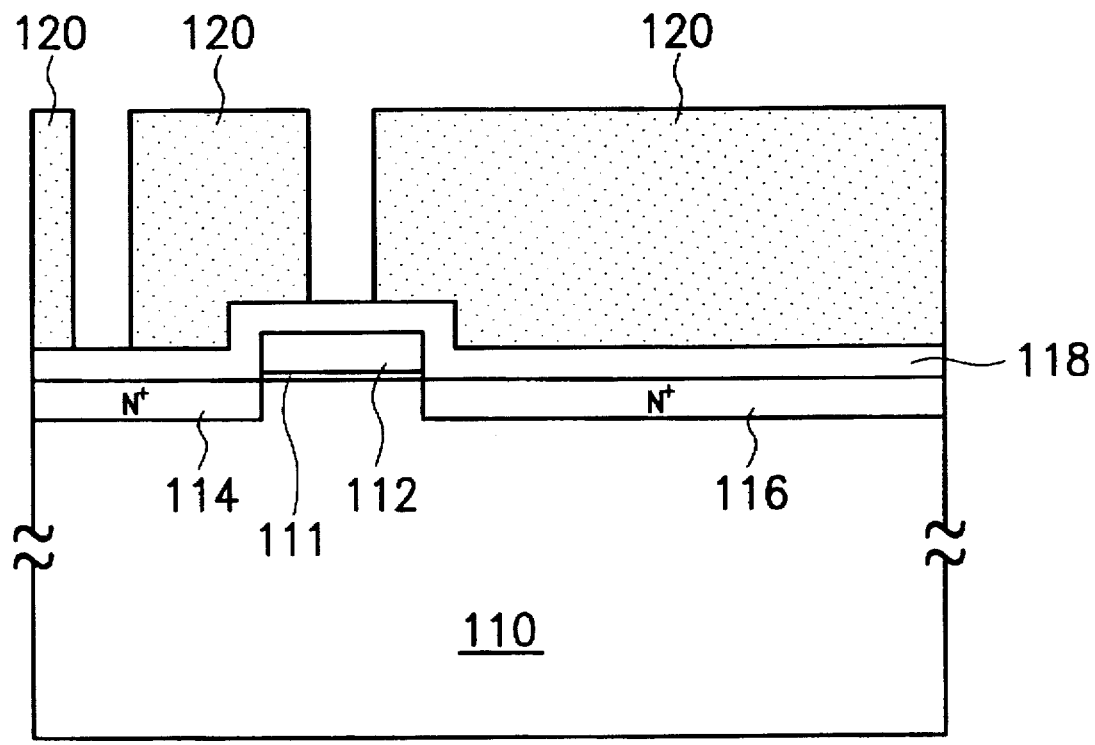
Figure 3C:
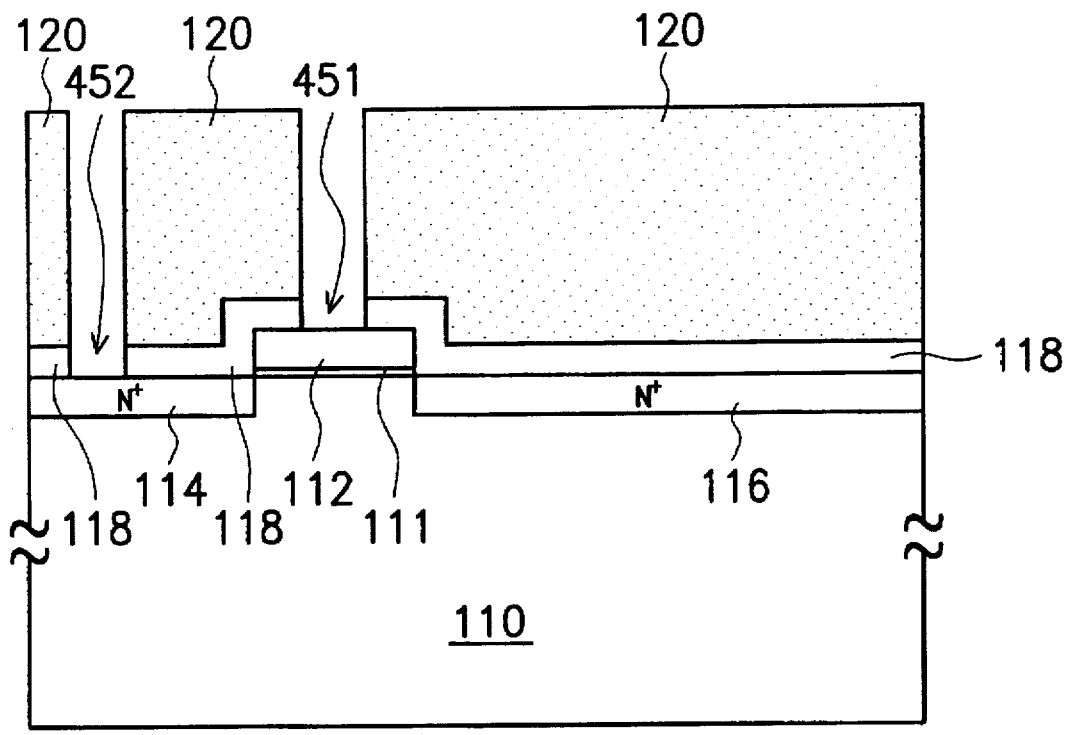
Figure 3D:
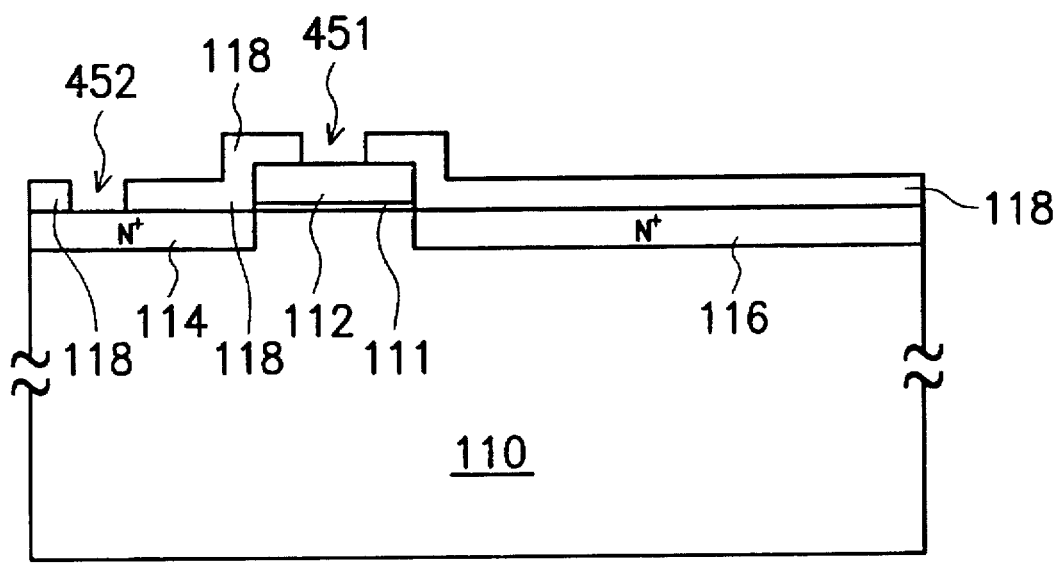
Figure 3E:
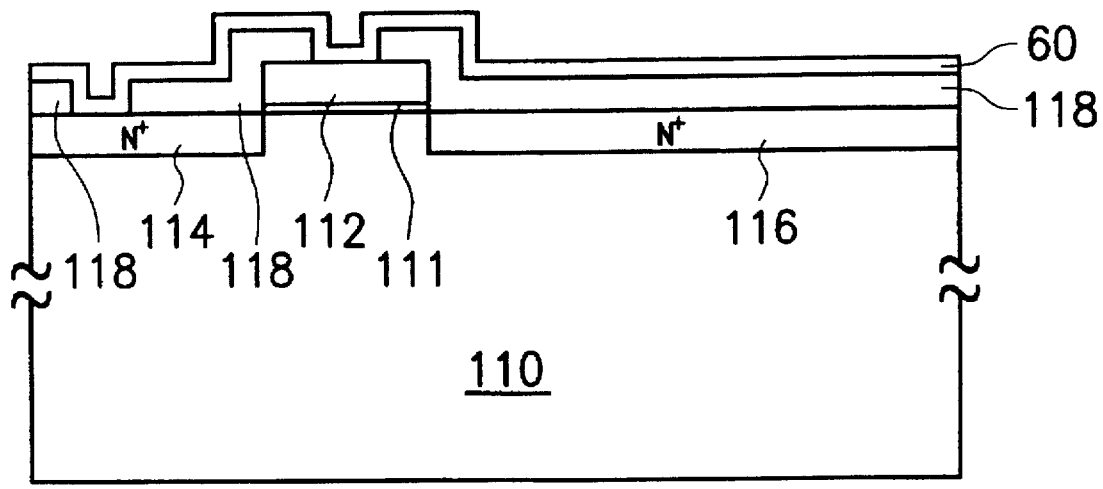
Figure 3F:
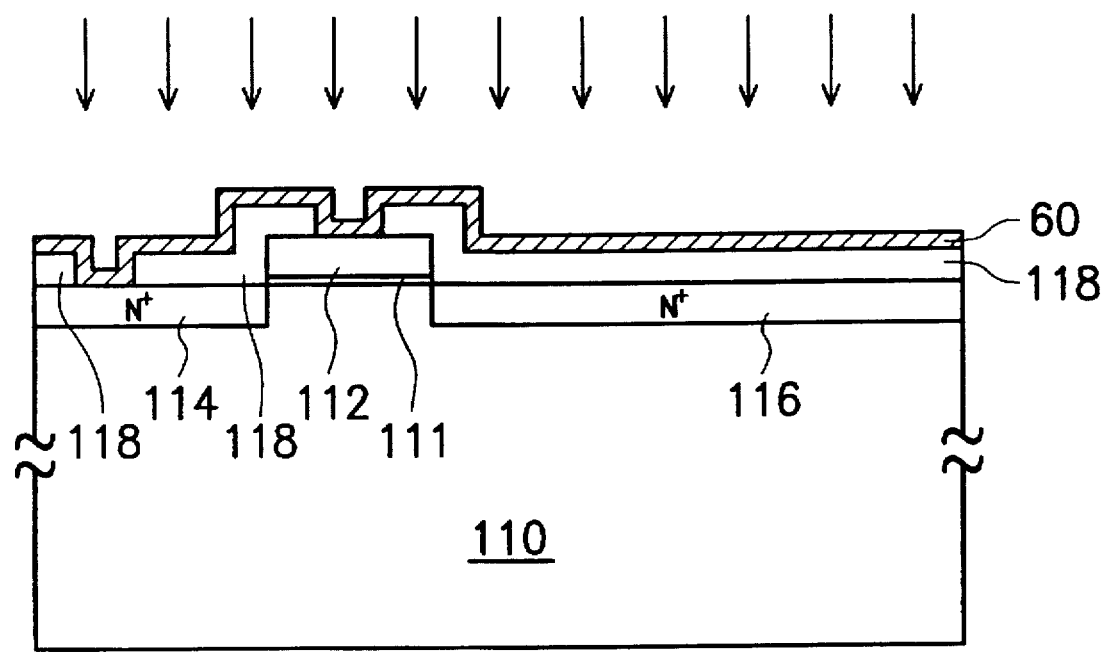
Figure 3G:
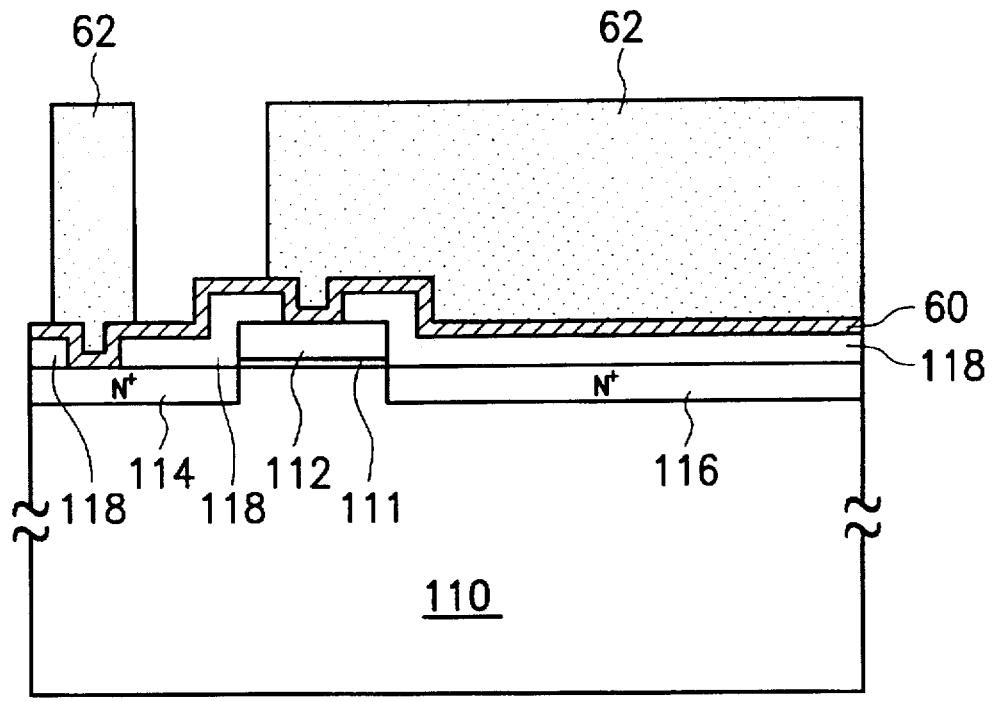
Figure 3H:
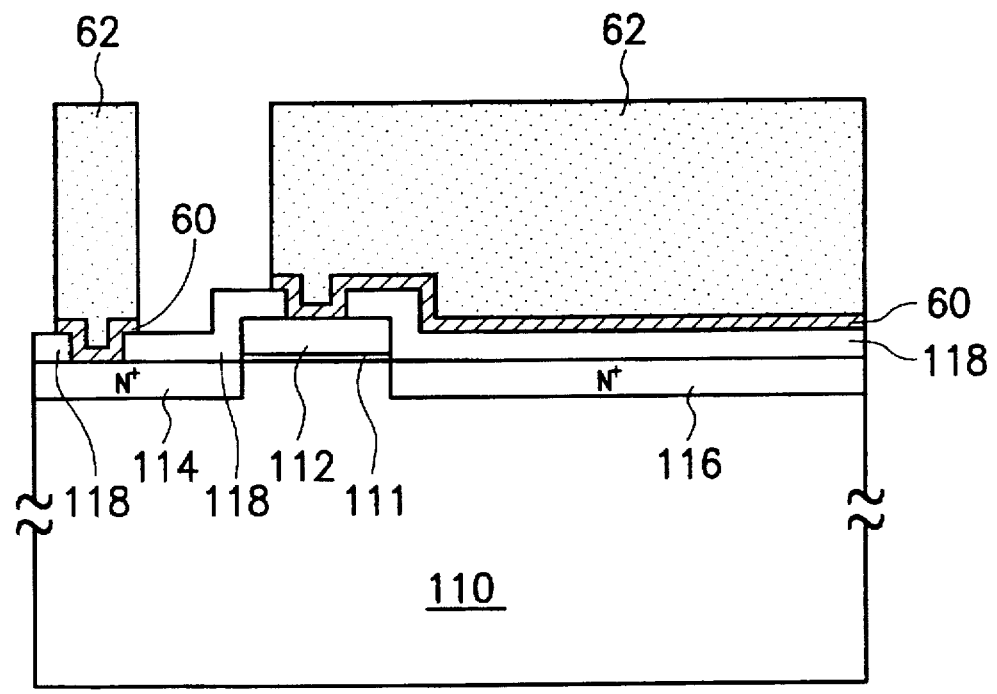
Figure 3I:
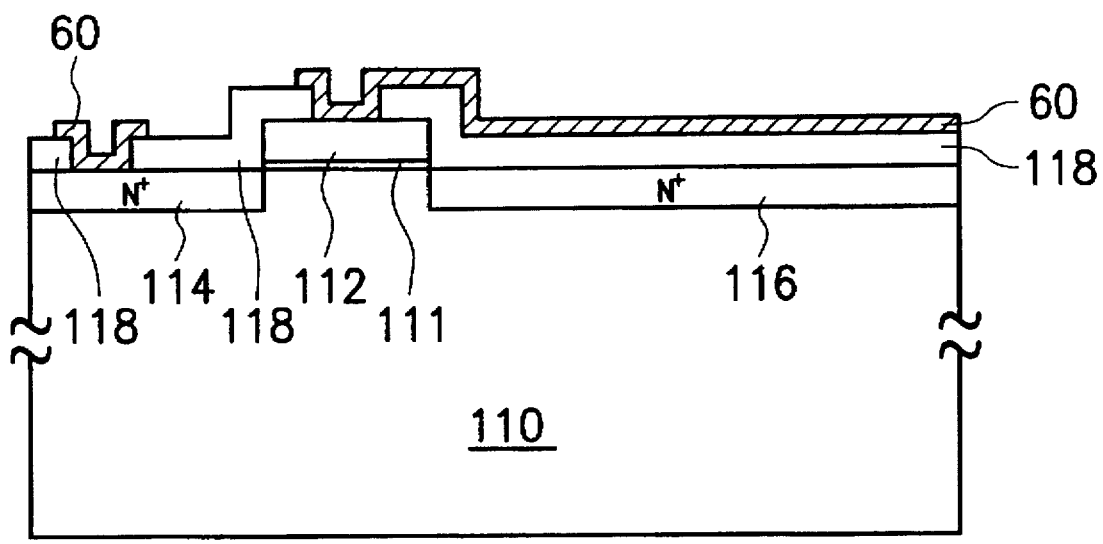
Figure 3J:
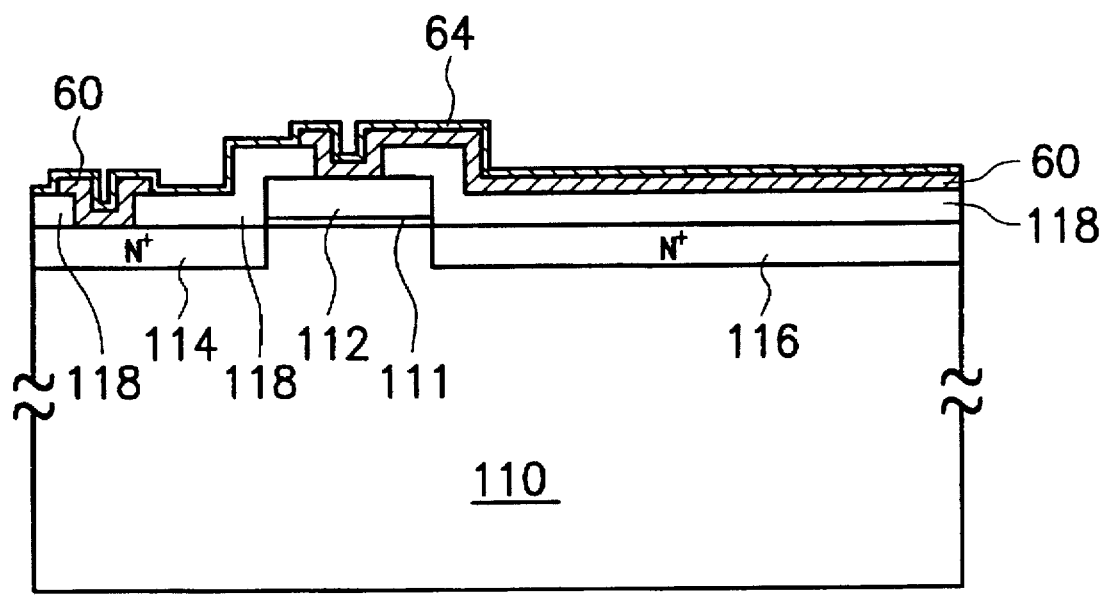
Figure 3K:
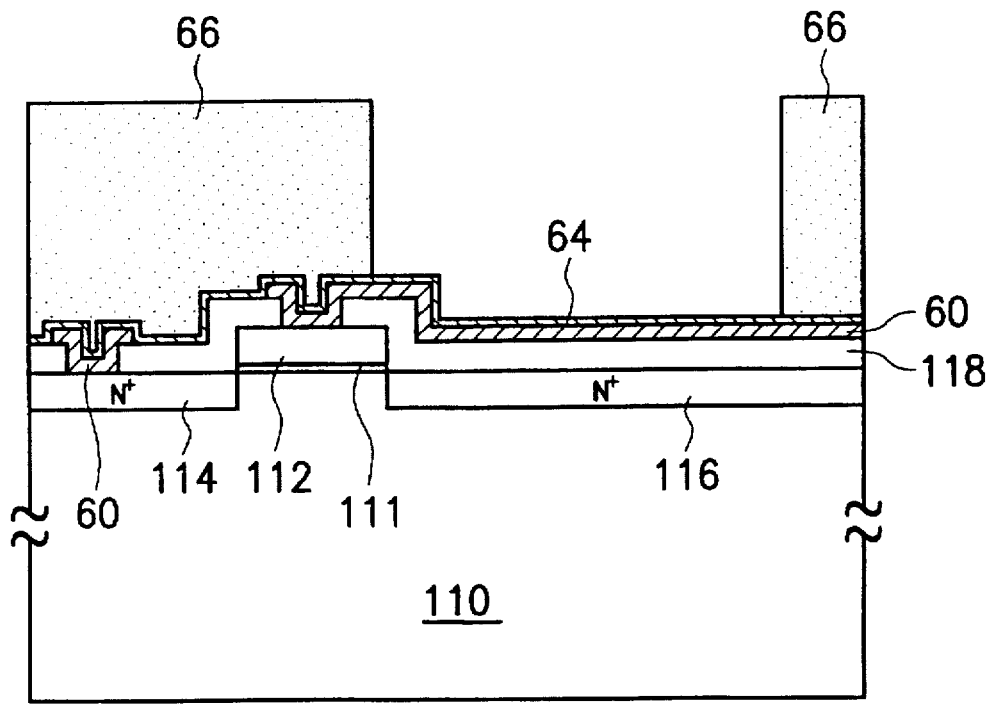
Figure 3L:
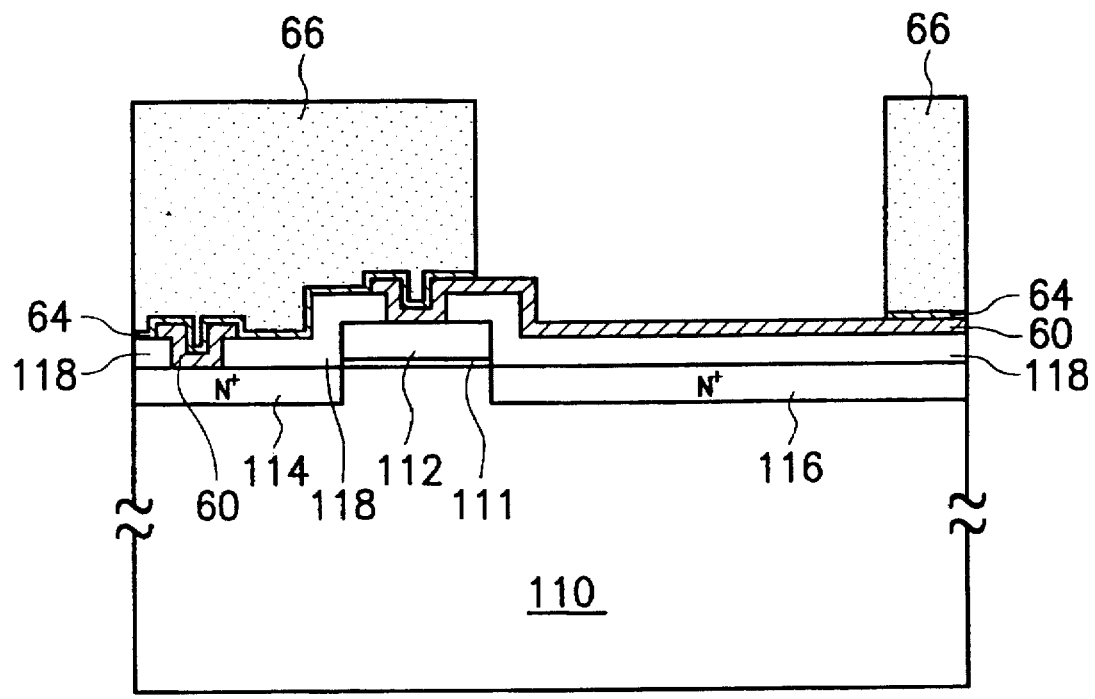
Figure 3M:
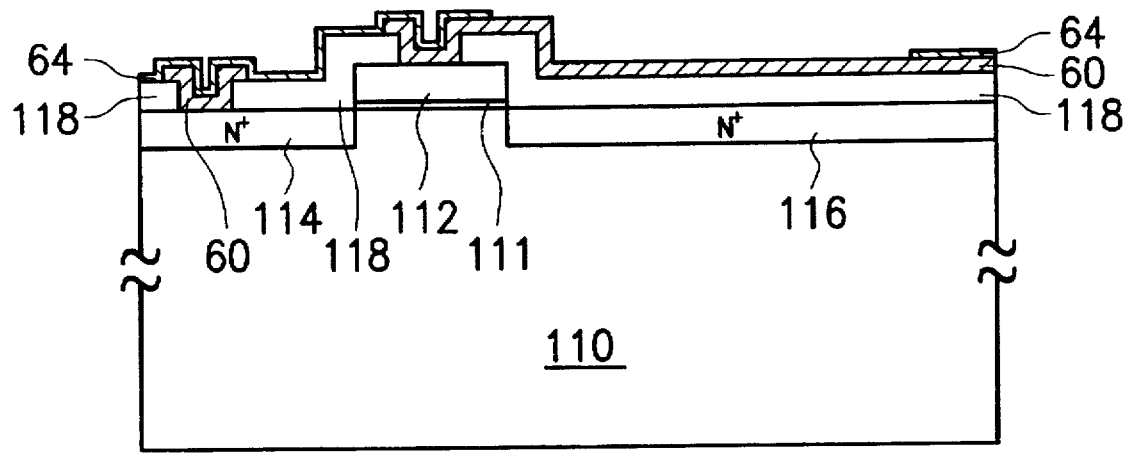
Figure 3N:
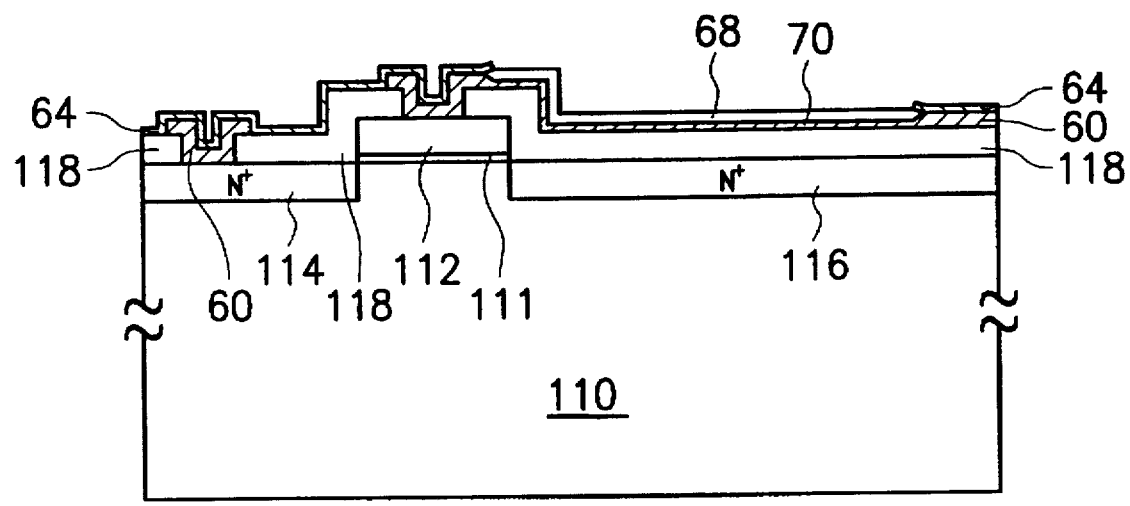
Figure 3O:
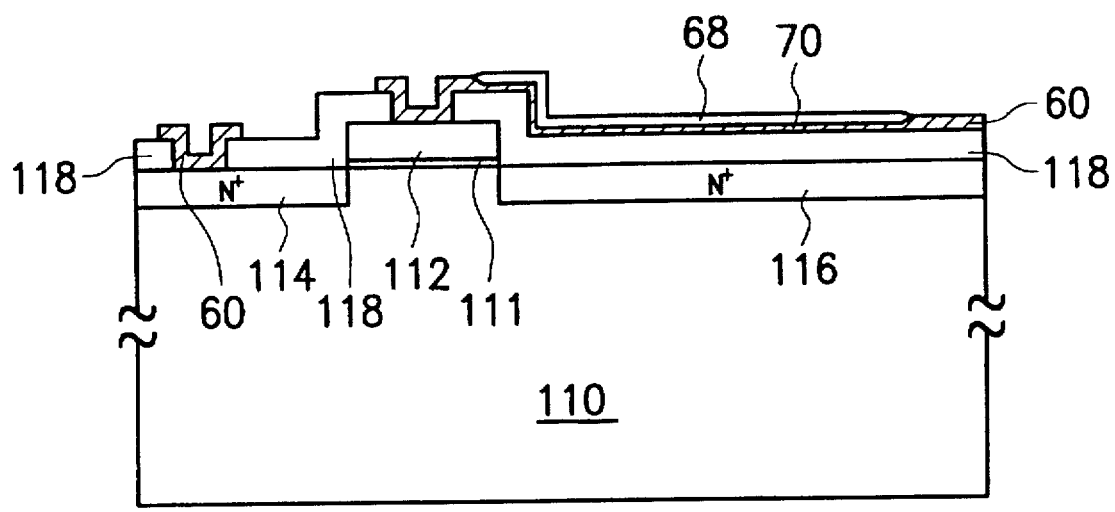
Figure 3P:
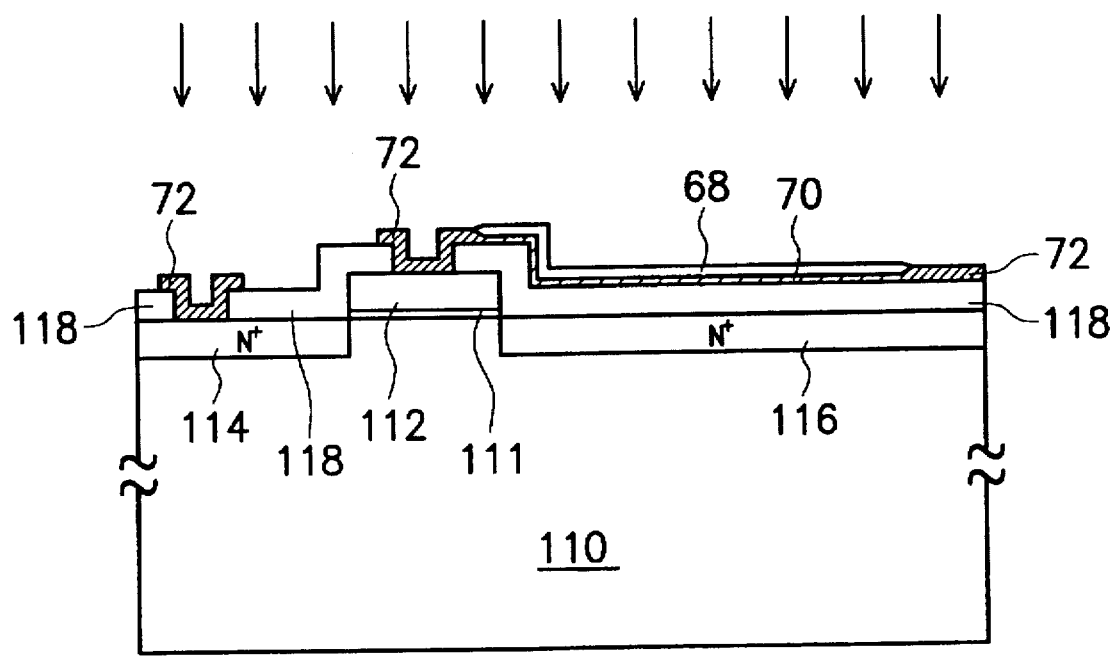

In accordance with the preferred embodiment of the invention, a process is provided for fabricating high-resistance load resistors utilizing dummy polysilicon in four-transistor SRAM devices, as illustrated in FIGS. 3A–3P.

First, as is shown as shown in FIG. 3A, an intermediate semiconductor device, complete with gate structure and source/drain regions of a transistor for the SRAM memory cell unit, is provided on the surface of a silicon substrate 110, which in the described embodiment is a P-type substrate. The gate structure of the transistor includes a gate electrode 112. A gate dielectric layer 111 directly underneath the gate electrode 112 is layered above the substrate 110. The gate dielectric layer 111 has a thickness of about 70 to 300 Å, and may first be formed, for example, by thermal oxidation. Afterwards, the gate electrode 112 may be formed by, for example, a chemical vapor deposition (CVD) procedure in which a polysilicon layer that is doped heavily and has a thickness of about 1,500 to 4,500 Å, is deposited on the gate dielectric layer 111. The source/drain regions 114 and 116 are N+ regions, which are formed utilizing conventional methods. An inter-polysilicon dielectric layer 118 is then formed to cover the surface of the device substrate at this stage. This inter-polysilicon dielectric layer 118 may be formed by, for example, a CVD procedure by depositing silicon oxide to a thickness of about 500 to 3,000 Å.

4

Next, referring to FIG. 3B, a photolithography procedure is performed in which a photoresist layer 120 is formed over the surface of the dielectric layer 118 and then is patterned to expose those portions of the dielectric layer 118 intended to be removed.

Then, as shown in FIG. 3C, exposed portions of the dielectric layer 118, not covered by the photoresist layer 120, are removed by an anisotropic etching procedure. This forms vias 451 and 452 in the dielectric layer 118 that facilitate a connection between the gate electrode 112 and the N+ source/drain region 114. The anisotropic etching may be implemented using an etchant gas such as, $CHF_3/CF_4$. At the conclusion of this etching procedure, the photoresist layer 120 may be removed, as shown in FIG. 3D.

Next, referring to FIG. 3E, a layer of polysilicon 60 may be formed to cover the surface of the device substrate. This polysilicon layer 60 may be formed by, for example, a CVD procedure that deposits the same to a thickness of about 300 to 3,000 Å. Then, as illustrated in FIG. 3F, using an ion implantation procedure, the resistance of the polysilicon layer 60 may be adjusted by implanting impurities such as arsenic, phosphorus, $BF_2$ or boron therein. The implantation procedure may be performed at an energy level of about 5 to 150 KeV, to achieve an impurity dosage of about $1 \times 10^{13}$ to $3 \times 10^{14}$ ions/cm$^2$. In another preferred embodiment, the implantation procedure may not be necessary.

Then, referring to FIG. 3G, a photolithography procedure is performed that first provides a layer of patterned photoresist layer 62 that reveals portions of the polysilicon layer 60 between the gate electrode 112 and the source/drain region 114, which are required to be removed. As is shown in FIG. 3H, anisotropic etching performed during the photolithography procedure then removes those exposed portions of the polysilicon layer 60, to provide a discontinuity in the polysilicon layer 60. Such anisotropic etching may be performed, for example, using an $HBr/Cl_2/O_2$ etchant gas.

Next, referring to FIG. 3I, the photoresist layer 62 is removed, and referring to FIG. 3J, an oxidation resistant layer 64 such as a silicon nitride ($Si_3N_4$) layer having a thickness of about 200 to 2,000 Å is formed using, for example, a CVD procedure.

Next, as is shown in FIG. 3K, a second photolithography procedure is performed to form a patterned photoresist layer 66 over the surface of the oxidation resistant layer 64. The patterning of the photoresist layer 66 reveals those portions of the layer 64 to be removed. Referring to FIG. 3L, the etching phase of this second photolithography procedure is used to remove such exposed portions of the oxidation resistant layer 64. Etchant gas employed for this anisotropic etching procedure may be, for example, $CF_4/O_2$ or $C_2F_6$. Afterwards, the photoresist layer 66 is removed, as is shown in FIG. 3M.

Then, as shown in FIG. 3N, an oxide layer 68 may be formed over the surface of the exposed polysilicon layer 60. This can be accomplished, for example, by performing a local oxidation of silicon (LOCOS) procedure in a furnace containing an $O_2$ or $H_2O$ ambient that is heated to a temperature in the range of about 800° to about 1,150° C. The controlled thermal oxidation procedure oxidizes only the exposed portions of the polysilicon layer 60, not covered by the oxidation resistant layer 64, and forms an oxide layer 68 having a thickness of about 500 to 5,000 Å. Thus, by this procedure the thickness of the polysilicon layer 60 beneath the oxide layer 68 is effectively reduced. These portions of the polysilicon layer 60 are the portions designated to serve as the load resistors 70 for the SRAM memory cell unit being fabricated.

Next, referring to FIG. 3O, the oxidation resistant layer 64 may be removed by, for example, etching in boiling 85% phosphoric acid at a temperature of about 180° C. Finally, as shown in FIG. 3P, impurity ions may be implanted into regions of the polysilicon layer 60 not covered by the oxide layer 68. This reduces the resistance in the implanted regions that comprise the interconnectors 72 for the memory cell unit. In this ion implantation procedure, arsenic, phosphorus, $BF_2$ or boron ions may be used as the impurity ions. The implantation procedure may be performed at an energy level of about 5 to 80 KeV, to achieve an impurity dosage of about $1 \times 10^{15}$ to $5 \times 10^{15}$ ions/cm$^2$.

In accordance with the above-described embodiment of the invention for the fabrication of the load resistors for the SRAM device memory cell units, both the load resistors and interconnectors in the cell units are formed in the same polysilicon layer. An important aspect of this process is the use of the LOCOS procedure to reduce the portions of the polysilicon to be formed into the load resistors. The procedure reduces the thickness of the load resistors without affecting that of the interconnectors. This allows for the formation of a relatively thicker layer for the interconnectors and a thinner layer for load resistors.

While the invention has been described by way of example and in terms of preferred embodiments, it is to be understood that the invention is not so limited. Rather, it is intended to cover various modifications and similar procedures, and the scope of the appended claims should be accorded the broadest interpretation so as to encompass all such modifications and similar procedures.

What is claimed is:

1. A process for fabricating load resistors for memory cell units of a static random-access memory device comprising the steps of:

(a) providing a silicon substrate containing an intermediate semiconductor device including a gate structure and source/drain regions for a transistor of the cell unit;

(b) forming a first dielectric layer over the silicon substrate, the first dielectric layer having opening vias connecting to a gate electrode of the gate structure and one of the source/drain regions;

(c) depositing a polysilicon layer;

(d) patterning the polysilicon layer by etching, to form a discontinuity in the polysilicon layer between the gate electrode and the one of the source/drain regions;

(e) forming an oxidation resistant layer;

(f) designating regions of the polysilicon layer for formation of load resistors;

(g) patterning the oxidation resistant layer to expose the designated regions;

(h) forming an oxide layer over a surface of the exposed portions of the polysilicon layer, such that a thickness of the designated regions of the polysilicon layer beneath the oxide layer is reduced;

(i) removing the oxidation resistant layer;

(j) designating exposed regions of the polysilicon layer not covered by the oxide layer, for formation of interconnectors of the memory cell unit; and (k) implanting impurities into the designated exposed regions of the polysilicon layer.

2. The process of claim 1, wherein the polysilicon layer deposited in step (c) has a thickness in the range of about 300 to 3,000 Å.

3. The process of claim 1, wherein the oxidation resistant layer is a silicon nitride layer formed by chemical vapor deposition.

4. The process of claim 3, wherein the silicon nitride layer has a thickness in the range of about 200 to 2,000 Å.

5. The process of claim 1, wherein said step (g) includes the step of anisotropically etching the oxidation resistant layer.

6. The process of claim 1, wherein said step (h) includes oxidizing in an environment heated to a temperature of about 800° to 1,150° C.

7. The process of claim 6, wherein the oxide layer has a thickness in the range of about 500 to 5,000 Å.

8. The process of claim 1, wherein said step (c) includes the step of lightly doping the polysilicon layer.

* * * * *